US011453958B2

(12) United States Patent
Fujikawa

(10) Patent No.: US 11,453,958 B2
(45) Date of Patent: Sep. 27, 2022

(54) HEAT-INSULATING SHIELD MEMBER AND SINGLE CRYSTAL MANUFACTURING APPARATUS HAVING THE SAME

(71) Applicant: SHOWA DENKO K.K., Tokyo (JP)

(72) Inventor: Yohei Fujikawa, Hikone (JP)

(73) Assignee: SHOWA DENKO K.K., Tokyo (JP)

(*) Notice: Subject to any disclaimer, the term of this patent is extended or adjusted under 35 U.S.C. 154(b) by 0 days.

(21) Appl. No.: 16/389,347

(22) Filed: Apr. 19, 2019

(65) Prior Publication Data

US 2019/0330765 A1 Oct. 31, 2019

(30) Foreign Application Priority Data

Apr. 26, 2018 (JP) .............................. JP2018-085453

(51) Int. Cl.
*C30B 35/00* (2006.01)
*C30B 25/08* (2006.01)
(Continued)

(52) U.S. Cl.
CPC ............ *C30B 25/08* (2013.01); *C30B 25/105* (2013.01); *C30B 25/12* (2013.01); *C30B 29/06* (2013.01); *C30B 29/36* (2013.01); *C30B 35/002* (2013.01)

(58) Field of Classification Search
CPC ..... C30B 23/00; C30B 23/002; C30B 23/005; C30B 23/02; C30B 23/06; C30B 23/08;
(Continued)

(56) References Cited

U.S. PATENT DOCUMENTS

| 2005/0120943 A1* | 6/2005 | Kordina | .................. | C30B 25/00 117/11 |
| 2006/0144326 A1* | 7/2006 | Einhaus | ................ | C30B 11/002 117/200 |

(Continued)

FOREIGN PATENT DOCUMENTS

| CN | 108026663 A | 5/2018 |
| JP | 01014139 A * | 1/1989 |

(Continued)

OTHER PUBLICATIONS

The Engineering Toolbox website on the thermal conductivity of air, accessed at https://www.engineeringtoolbox.com/air-properties-viscosity-conductivity-heat-capacity-d_1509.html on Jun. 16, 2020. (Year: 2020).*

(Continued)

*Primary Examiner* — Kenneth A Bratland, Jr.

(74) *Attorney, Agent, or Firm* — Sughrue Mion, PLLC

(57) ABSTRACT

The present invention provides a heat-insulating shield member, wherein the heat-insulating shield member is arranged and used between a SiC source housing (3) and a substrate support (4) in a single crystal manufacturing apparatus (10), wherein the single crystal manufacturing apparatus (10) comprises a crystal growth container (2) and a heating member (5) arranged on an outer periphery of the crystal growth container (2), wherein the crystal growth container (2) includes the SiC source housing (3) disposed at a lower portion of the apparatus, and the substrate support (4) which is arranged above the SiC source housing (3) and supports a substrate (S) used for crystal growth so as to face the SiC source housing (3), and wherein the single crystal manufacturing apparatus (10) is configured to grow a single crystal (W) from a SiC source (M) on the substrate (S) by sublimating the SiC source (M) from the SiC source housing (3).

20 Claims, 5 Drawing Sheets

(51) Int. Cl.
*C30B 29/36* (2006.01)
*C30B 25/10* (2006.01)
*C30B 25/12* (2006.01)
*C30B 29/06* (2006.01)

(58) Field of Classification Search
CPC ......... C30B 25/00; C30B 25/02; C30B 25/10; C30B 25/105; C30B 25/12; C30B 29/00; C30B 29/10; C30B 29/06; C30B 29/36; Y10T 117/00; Y10T 117/10; Y10T 117/1016
USPC ..... 117/84, 88–89, 102, 105, 200, 204, 217, 117/937, 951
See application file for complete search history.

(56) References Cited

U.S. PATENT DOCUMENTS

| | | | |
|---|---|---|---|
| 2010/0061914 A1* | 3/2010 | Zwieback | C30B 35/00 423/345 |
| 2011/0042817 A1 | 2/2011 | Furusawa et al. | |
| 2013/0000547 A1* | 1/2013 | Kogoi | C30B 29/36 117/106 |
| 2013/0280466 A1* | 10/2013 | Zwieback | C30B 29/36 428/64.1 |
| 2014/0123892 A1* | 5/2014 | Vladimirov | C30B 29/06 117/223 |
| 2015/0152569 A1* | 6/2015 | Okada | C30B 29/36 117/28 |

FOREIGN PATENT DOCUMENTS

| | | |
|---|---|---|
| JP | 11-255597 A | 9/1999 |
| JP | 2000-264795 A | 9/2000 |
| JP | 2000264795 A * | 9/2000 |
| JP | 2000-351670 A | 12/2000 |
| JP | 2001-192299 A | 7/2001 |
| JP | 2002-060297 A | 2/2002 |
| JP | 2009-018957 A | 1/2009 |
| JP | 2012-020893 A | 2/2012 |
| JP | 2012-248764 A | 12/2012 |
| JP | 2013-166672 A | 8/2013 |
| JP | 2015-051922 A | 3/2015 |
| JP | 2016-17001 A | 2/2016 |
| JP | 2016-092122 A | 5/2016 |
| WO | 2010/125800 A | 10/2012 |

OTHER PUBLICATIONS

MatWeb Material Property Data for Niobium Carbide, accessed at http://www.matweb.com/search/datasheet.aspx?matguid=55a1695437e54b4d8b98aeb2d658f0f6&ckck=1 on Jun. 16, 2020. (Year: 2020).*
"Carbon Fiber-Reinforced Carbon: Properties, Uses, Forms Supplied" product manual published May 2004 by SGL Carbon Group. (Year: 2004).*
Communication dated Oct. 29, 2020 from the China Intellectual Property Administration in Application No. 201910335471.0.
Communication dated May 25, 2021 by the German Patent Office in application No. 10 2019 109 551.4.
Office Action dated Oct. 26, 2021 by Japanese Patent Office in Japanese Application No. 2018-085453.

* cited by examiner

HEAT-INSULATING SHIELD MEMBER AND SINGLE CRYSTAL MANUFACTURING APPARATUS HAVING THE SAME

BACKGROUND OF THE INVENTION

Field of the Invention

The present invention relates to a heat-insulating shield member and a single crystal manufacturing apparatus having the same.

Priority is claimed on Japanese Patent Application No. 2018-85453, filed on Apr. 26, 2018, the content of which is incorporated herein by reference.

Description of Related Art

Silicon carbide (SiC) has a breakdown electric field larger by one digit than and the band gap three times larger than those of silicon (Si). Moreover, silicon carbide (SiC) has characteristics such as thermal conductivity being about three times higher than silicon (Si). Silicon carbide (SiC) is expected to be applied to power devices, high frequency devices, high temperature operation devices, and the like. For such SiC devices, a SiC epitaxial wafer having a SiC epitaxial film formed on a SiC substrate (SiC wafer) is used.

Silicon carbide has many crystal polymorphs (polytypes) each of which has the same composition stoichiometrically but differs in the stacking pattern of atoms (only in the C-axis direction). Representative polytypes are 3C, 4H, 6H, etc. In particular, since the 4H silicon carbide single crystal has good characteristics of band gap, saturated electron velocity and the like, it is suitable to a main substrate material of optical devices and electronic devices.

SiC wafers are fabricated by cutting a SiC ingot. In recent years, a diameter of the SiC wafer is required to be enlarged with the demand of the market. Therefore, there is an increasing demand for increasing the diameter and length of the SiC ingot itself.

The SiC ingot (silicon carbide single crystal) is manufactured by a sublimation method.

Growth of a silicon carbide single crystal by sublimation will be described using a single crystal manufacturing apparatus 100 shown in a schematic cross-sectional view in FIG. 5.

According to the sublimation, in a crystal growth container (crucible) 101 which is usually made of graphite, SiC source portion (SiC source powder) 102, which is stored in a lower portion of the crystal growth container, and a single crystal growth substrate (seed crystal) 104, which is attached to a lower surface of a lid 103, are arranged facing each other. Then, the SiC source portion 102 is heated and sublimed, and SiC source gas is introduced onto the seed crystal 104 and recrystallized on the seed crystal 104 to grow a single crystal 105.

In the crucible, temperature is controlled so that the seed crystal has lower temperature than the SiC source portion, whereby the SiC source gas is easily recrystallized on a surface of the seed crystal. Radiation from the SiC source portion 102 on a high-temperature side forms a temperature distribution of the seed crystal 104, and consequently, it determines a growth-surface shape. As a method of controlling the growth-surface shape, providing a shield plate 106 made of a circular flat plate is known (for example, see Patent Documents 1 to 3).

In this method, radiation from the SiC source portion 102 to the seed crystal is irradiated via the shield plate 106. By controlling the temperature distribution on an upper surface of the shield plate 106, an isothermal surface shape of the seed crystal can be tailored to be flat or convex.

That is, the-growth surface shape can be controlled to be flat or convex.

The seed crystal 104 avoids directly receiving the radiant heat of the SiC source portion 102 by the shield plate 106 shown in FIG. 5. However, the shield plate 106 itself receives the radiant heat from the high-temperature SiC source and is heated.

In Patent Document 1, a problem is pointed out that the temperature of the shield plate 106 itself rises, the temperature of a central portion of the single crystal 105 rises due to the heat radiation from the shield plate 106, and the central portion of the single crystal 105 is thermally etched, and thus a dent occurs as shown in FIG. 5. In order to solve this problem, provided are a shield plate having a structure in which the central portion is recessed (hereinafter may be referred to as a "center-recessed shield plate"); and a shield plate made of two types of materials having different thermal conductivities, in which a first material constituting the central portion is made of a material having thermal conductivity smaller than that of a second material constituting a peripheral portion (hereinafter may be referred to as a "center-low thermally conductive shield plate").

Meanwhile, In Patent Document 2, a problem is pointed out that, in a case where one flat shield plate (hereinafter sometimes may be referred to as a "single shield plate") is used, the surface temperature of the single shield plate is nonuniform, thus surface temperatures of the seed crystal receiving thermal radiation and the growing crystal are also nonuniform, and consequently, the growth surface of the grown silicon carbide single crystal is not flat and a high-quality silicon carbide single crystal cannot be obtained. In order to solve this problem, Patent Document 2 proposes a shield plate (hereinafter may be referred to as a "multiple shield plate"), which is formed by a plurality of plate members having gaps provided therebetween, and supported by outer peripheral portions of the plurality of plate members; or a shield plate (hereinafter may be referred to as a "thick shield plate") in which a plate thickness of a plate member is at least twice as large as a diameter of a supporting portion of a supporting rod. It is described such that the multiple shield plate is able to have substantially uniform temperature at upper surfaces of the plate members on a side closest to the seed crystal or the grown crystal of the plurality of plate members, by the thermal radiation of each of the plurality of plate members, and therefore it is possible to make the grown-surface of silicon carbide single crystal flat, and it is also described such that the effect of providing uniform temperature of upper surface can be obtained by the thick shield plate similar to the multiple shield plate.

In Patent Document 3, a problem is pointed out that, since the SiC source portion 102 is heated from an outer peripheral side, temperature distribution occurs such that the heated SiC source portion 102 has a higher temperature at the outer peripheral side than at the central portion, and thus radial temperature distribution also occurs on the shield plate 106. It is also described such that consequently, the seed crystal 104 or the growth crystal 105 also has the nonuniform surface temperature in the radial direction. In order to solve this problem, Patent Document 3 proposes a shield plate (hereinafter may be referred to as a "plural ring-shaped shield plate") which is formed by a plurality of ring-shaped members having openings of different inner diameters and different specific heats, and in which ring-shaped members are arranged from the center toward the ends in orders of degrees of specific heat; or a shield plate (hereinafter may be referred to as a "gradually and radially increasing thickness shield plate") which is made of a single member, has a plurality of permeable holes through which the source gas permeates, and gets thicker from the center toward the end thereof.

Meanwhile, in order to increase the diameter and the length of the SiC ingot itself, for example, Patent Document 4 proposes a single crystal manufacturing apparatus provided with a tapered guide member to increase the diameter of the SiC single crystal. However, when the single crystal grown from the seed crystal is in contact with a polycrystal grown on a guide member, it causes defects, polytype inclusion(s), cracks, and so on, which may degrade the quality of the SiC ingot. In order to avoid such a problem, according to Patent Document 5, the tapered guide member is kept at a high temperature to suppress the crystal growth of polycrystalline SiC on the surface of the guide member.

CITATION LIST

Patent Literature

Patent Document 1: Japanese Unexamined Patent Application, First Publication No. H11-255597
Patent Document 2: Japanese Unexamined Patent Application, First Publication No. 2000-264795
Patent Document 3: Japanese Unexamined Patent Application, First Publication No. 2015-051922
Patent Document 4: Japanese Unexamined Patent Application, First Publication No. 2002-060297
Patent Document 5: Japanese Unexamined Patent Application, First Publication No. 2013-166672
Patent Document 6: Japanese Unexamined Patent Application, First Publication No. 2012-020893
Patent Document 7: Japanese Unexamined Patent Application, First Publication No. 2012-248764

SUMMARY OF THE INVENTION

For developing the SiC ingot (silicon carbide single crystal), it is always required to increase the diameter and the length. The dimensions targeted at that time were implemented once, and then the subsequent dimension would be the next target. In order to implement the targeted dimensions, totally new configuration has been proposed (for example, Patent Document 4), the configuration of the related art has been improved (for example, Patent Documents 1 to 3), or new usage (for example, Patent Document 5) has been suggested.

The present inventors have studied and recognized that it is important to solve the dilemma described below in order to further increase the diameter and length of the 4H—SiC ingot.

That is, in order to further increase the diameter and increase the length, it is essential to improve the growth rate. However, when the temperature of the SiC source portion (especially the SiC source surface, represented by a reference numeral 102a in FIG. 5) is raised for improving the sublimation rate of the SiC source from the SiC source portion, the surface temperature of the seed crystal or the grown crystal also rises, whereby a problem is caused wherein 6H—SiC tends to be mixed. On the other hand, when the temperature of the SiC source portion is lowered to suppress the growth of 6H—SiC, a problem is caused wherein precipitation occurs on the surface of the SiC source as the growth time becomes longer in further increasing the diameter and length. In order to increase the diameter and the length, it is necessary to fill a crucible with a large amount of SiC source. However, when heating a lower portion of the SiC source of the crucible filled with a large amount of SiC source, almost of the temperature difference provided on the crucible affects inside of the SiC source. Therefore, the temperature difference between the lower part and the surface of the SiC source increases. As a result, a source gas sublimed at the lower part is saturated on the surface of the SiC source, and precipitates on the SiC source surface without reaching the seed crystal. Precipitation on the SiC source surface causes that the SiC source gas cannot be effectively applied for the growth of the single crystal, and also leads to growth stability deterioration and quality deterioration. In a case where the temperature of the SiC source surface is raised to the high temperature, for example, by moving a heating center close to the SiC source surface in order to suppress the precipitation on the SiC source surface, 6H—SiC is mixed due to the temperature rise of the seed crystal.

As described above, in further increasing the diameter and length, the dilemma occurs that the temperature of the SiC source portion cannot be effectively either raised or lowered.

However, this dilemma is not eliminated by any of the shield plate of the related art described above, i.e. the center-recessed shield plate, the center-low thermally conductive shield plate, the single shield plate, the multiple shield plate, the thick shield plate, the plural ring-shaped shield plate, and the gradually and radially increasing thickness shield plate.

The inventors of the present invention have further continued extensive studies regardless of the recent development trend of shield plates wherein heat equalization in the radial direction is desired. Thus the inventors have arrived at a heat-insulating shield plate of the present invention based on the simple technical idea wherein the temperature of the SiC source portion (particularly the SiC source surface) is increased without raising the surface temperature of the seed crystal or growing crystal (reducing the temperature as low as possible). The heat-insulating shield member of the present invention seems to be a technology merely close to or similar to the shield plate of the related art, which is not true.

The present invention is achieved by the technique wherein the temperature of the SiC source portion (particularly the SiC source surface) increases without raising the surface temperature of the seed crystal or the growing crystal (reducing the temperature as low as possible), by increasing the temperature difference between the SiC source surface and the surface temperature of the seed crystal or the growing crystal (hereinafter sometimes referred to as "vertical temperature difference").

The present invention is made based on the problem described above to provide a heat-insulating shield member capable of suppressing precipitation on the SiC source surface while suppressing contamination of 6H—SiC, and provides a single crystal manufacturing apparatus including the same.

In order to solve the above problems, the present invention provides means as follows.

(1) A heat-insulating shield member according to one aspect of the present invention is arranged and used between a SiC source housing and a substrate support in a single crystal manufacturing apparatus, wherein the single crystal manufacturing apparatus comprises a crystal growth container and a heating member arranged on an outer periphery of the crystal growth container, wherein the crystal growth container includes the SiC source housing wherein the SiC source housing is disposed at a lower portion of the apparatus, and the substrate support wherein the substrate support is arranged above the SiC source housing and supports a substrate so as to face the SiC source housing, and wherein the single crystal manufacturing apparatus is configured to grow a single crystal from a SiC source on the substrate by sublimating the SiC source from the SiC source housing.

(2) The heat-insulating shield member described in (1) may contain a low thermally conductive carbon material having thermal conductivity lower than graphite.

(3) In the heat-insulating shield member described in (2), the low thermally conductive carbon material may be is either a carbon fiber material or expanded graphite.

(4) In the heat-insulating shield member described in (2), the low thermally conductive carbon material may be a graphite material having thermal anisotropy.

(5) The heat-insulating shield member described in any one of (1) to (4) may have a structure in which a heat-insulating material is surrounded by a graphite material.

(6) The heat-insulating shield member described in any one of (1) to (5) may have a surface which is coated by a metal carbide layer.

(7) A single crystal manufacturing apparatus according to one aspect of the present invention is provided with the heat-insulating shield member as set forth in any one of (1) to (6).

According to the heat-insulating shield member of the present invention, it is possible to suppress the precipitation on the SiC source surface while suppressing the growth of the 6H—SiC single crystal.

DETAILED DESCRIPTION OF THE INVENTION

Hereinafter, preferable examples of the present invention will be described in detail with reference to the drawings as appropriate. The drawings used in the following description may include dimensions or ratios, enlargedly different from actual components for better understanding of features of the present invention or for the sake of convenience. The materials, dimensions, and the like, provided in the following description, are merely exemplary examples and the present invention is not limited thereto. Those parameters can be appropriately tailored within the range not departing the gist of the present invention. Unless otherwise specified, number, size, position, material, ratio, shape, etc. may be changed, added or omitted as necessary.

Hereinafter, the growth of a silicon carbide single crystal will be described as an example.

Heat-Insulating Shield Plate, Single Crystal Manufacturing Apparatus

Figure 1:
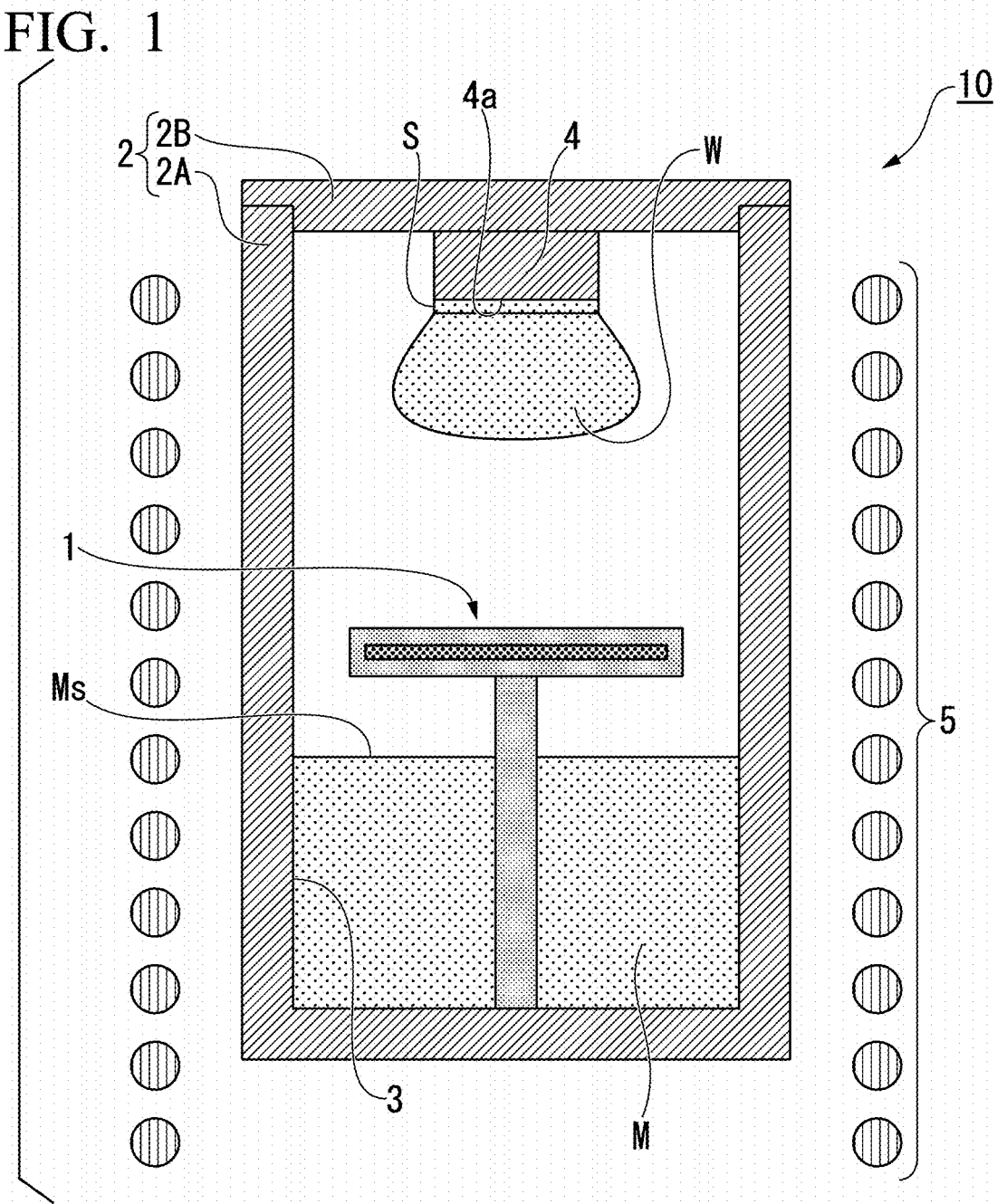
FIG. 1 is a schematic longitudinal cross-sectional view showing a preferable example of a heat-insulating shield member according to one embodiment of the present invention, and a single crystal manufacturing apparatus according to one embodiment of the present invention, which is provided with the same heat-insulating shield member.

FIG. 1 is a schematic longitudinal sectional view showing preferable examples of a heat-insulating shield member of the present invention, and a single crystal manufacturing apparatus, which is provided with the same heat-insulating shield member.

A heat-insulating shield member 1 of the present invention, as shown in FIG. 1, is arranged in a single crystal manufacturing apparatus 10. The single crystal manufacturing apparatus 10 includes a crystal growth container (crucible) 2 (formed by a crucible main body 2A and a crucible lid 2B) and heating member 5, which is arranged around the crystal growth container 2. The crystal growth container 2 has a SiC source housing 3 disposed at a lower portion thereof, and a substrate support (base) 4, which is arranged above the SiC source housing 3 and supports a crystal growth substrate (seed crystal) S so as to face the SiC source housing 3. In the single crystal manufacturing apparatus 10 for sublimating a SiC source (SiC source portion) M from the SiC source housing 3 to grow a single crystal W of the SiC source M on the substrate S, the heat-insulating shield member 1 is arranged and used between the SiC source housing 3 and the substrate support 4.

Further, a heat-insulating material (not shown) for keeping the temperature of the crucible 2 is preferably provided on an outer periphery of the crucible main body 2A. The seed crystal S is attached to the base 4 provided on the crucible lid 2B.

As shown in the drawings, a direction in which the base 4 and the silicon carbide single crystal growth SiC source M face each other is defined as a vertical direction (longitudinal direction), and a direction orthogonal to the vertical direction is defined as a left-and-right lateral direction (lateral direction).

It is preferable that the heat-insulating shield member of the present invention contains a heat-insulating material having thermal conductivity of 40 W/m·K or less at least in a thickness direction (corresponding to the vertical direction (longitudinal direction) in a case where the heat-insulating shield member is installed in the single crystal manufacturing apparatus), or alternatively, is formed of an insulating material having thermal conductivity of 40 W/m·K or less at least in the thickness direction. The thermal conductivity of 40 W/m·K or less is lower than the thermal conductivity of the graphite material used for the crucible.

Moreover, it is preferable that the heat-insulating material is subjected to high purification treatment so as to prevent impurities from entering the crystal.

The thermal conductivity of the heat-insulating shield member is preferably 30 W/m·K or less, more preferably 20 W/m·K or less, still more preferably 10 W/m·K or less, particularly preferably 5 W/m·K or less.

A lower limit of the thermal conductivity of the heat-insulating shield member is, as a rough guide, about 1 W/m·K. This thermal conductivity may be thermal conductivity evaluated at room temperature.

A "heat-insulating material having thermal conductivity of 40 W/m·K or less at least in the thickness direction" is, for example, a low thermally conductive carbon material having thermal conductivity lower than ordinary graphite, such as a graphite mass or isotropic high density graphite. Examples of such a low thermally conductive carbon material include graphite materials and porous carbon, such as carbon fiber material, expanded graphite, thermally anisotropic graphite material and the like. The thermally anisotropic graphite material is a graphite material in which thermal conductivity is anisotropic in the thickness direction and a direction orthogonal to the thickness direction, which is formed by, for example, pressing the expanded graphite into a compacted sheet shape (for example, see Japanese Unexamined Patent Application, First Publication No. H01-014139). Japanese Unexamined Patent Application, First Publication No. H01-014139 discloses a graphite sheet having thermal conductivity of 120 kcal/m·hr·°C. (about 140 W/m·k) in a plane direction and of 4 kcal/m·hr·°C. (about 4.7 W/m·K) in a thickness direction (in this case, the thermal conductivity in the thickness direction is 3.3% of the thermal conductivity in the plane direction); or a graphite sheet having thermal conductivity of 140 kcal/m·hr·°C. (about 163 W/m·k) in a plane direction and of 25 kcal/m·hr·°C. (about 29 W/m·K) in a thickness direction (in this case, the thermal conductivity in the thickness direction is 5.6% of the thermal conductivity in the plane direction). Characteristics such as physical properties and thickness of carbon fiber material and diameter of fiber can be optionally selected. Characteristics such as physical properties and thickness of expanded graphite can also be optionally selected.

The "heat-insulating material having thermal conductivity of 40 W/m·K or less at least in the thickness direction" is not limited to the carbon material, but may be metal carbide having high heat resistance, a substance formed by making porous of metal carbide (porous metal carbide) or a structure obtained by filling a graphite container with a metal carbide powder.

As a material of the heat-insulating shield member, in order to obtain a substantial heat-insulating effect (vertical temperature difference and/or temperature difference in SiC source) as compared with the graphite shield plate of the related art, the thermal conductivity of the material is preferably 40% or less, more preferably 30% or less, further preferably 20% or less, still more preferably 10% or less, particularly preferably 5% or less with respect to the graphite shield plate of the related art. As such a material, carbon fiber material and expanded graphite are preferable exemplary examples. In the simulation described later, a case where the thermal conductivity is 2.5% of the thermal conductivity of the graphite shield plate of the related art is adopted as a model of the heat-insulating shield member.

Since the thermal conductivity is 40 W/m·K or less "at least" in the thickness direction, the thermal conductivity may also be 40 W/m·K or less in a direction other than the thickness direction.

As compared with the heat-insulating shield member 1 of the present invention, graphite or graphite coated with TaC or SiC on its surface is used as a material of a shield plate of the related art (for example, see Patent Documents 4 and 5). The thermal conductivity of graphite is about 80 to 130 W/m·K (for example, see Japanese Unexamined Patent Application, First Publication No. 2000-351670), the thermal conductivity of TaC is about 90 W/m·K (for example, see Re-publication of PCT International Publication No. 2010-125800), and the thermal conductivity of SiC is about 200 W/m·K (for example, see Japanese Unexamined Patent Application, First Publication No. 2016-092122).

That is, the shield plate of the related art is made of a graphite-based material, and has thermal conductivity of about 80 to 130 W/m·K, which is slightly varied depending on the surface coating or types of graphite. Due to the thermal conductivity of this shield plate, in a case where a silicon carbide single crystal is grown using the shield plate of the related art, the seed crystal S or the grown crystal W has the thermally strong correlation with the SiC source surface Ms through the shield plate.

As the heat-insulating shield member 1 of the present invention, a thermally anisotropic shield member in which the thermal conductivity in the thickness direction (corresponding to the longitudinal direction described above) is smaller than the thermal conductivity in the plane direction (corresponding to the lateral direction described above) may be used. The degree of thermal anisotropy is not limited as long as the thermal conductivity is 40 W/m·K or less in the thickness direction. For instance, the thermal conductivity in the thickness direction may be 90% or less, 60% or less, 40% or less, 20% or less, 10% or less, 5% or less or 3% or less, of the thermal conductivity in the plane direction. For example, Japanese Unexamined Patent Application, First Publication No. H01-014139 discloses a graphite sheet in which the thermal conductivity in the thickness direction is 3.3% or 5.6% of the thermal conductivity in the plane direction. In the simulation described later, a case where the thermal conductivity in the thickness direction is 6.9% of the thermal conductivity of the graphite shield plate of the related art is adopted as a model of the heat-insulating shield member.

A graphite sheet such as Grafoil (registered trademark) is an exemplary example of a material of such a thermally anisotropic shield member.

In the center-low thermally conductive shield plate disclosed in Patent Document 1, porous carbon having thermal conductivity lower than that of graphite is disclosed as a material constituting the central portion thereof. However, the invention is disclosed as the invention for solving the problem of a dent formed by thermal etching at the central portion of the single crystal by controlling the temperature distribution on an upper surface of the shield plate. In other words, the invention focuses on the already-known temperature difference in the radial direction. Therefore, even those skilled in the art could not have been easily conceived a shield plate entirely made of porous carbon based on the invention described in Patent Document 1.

Figure 2:
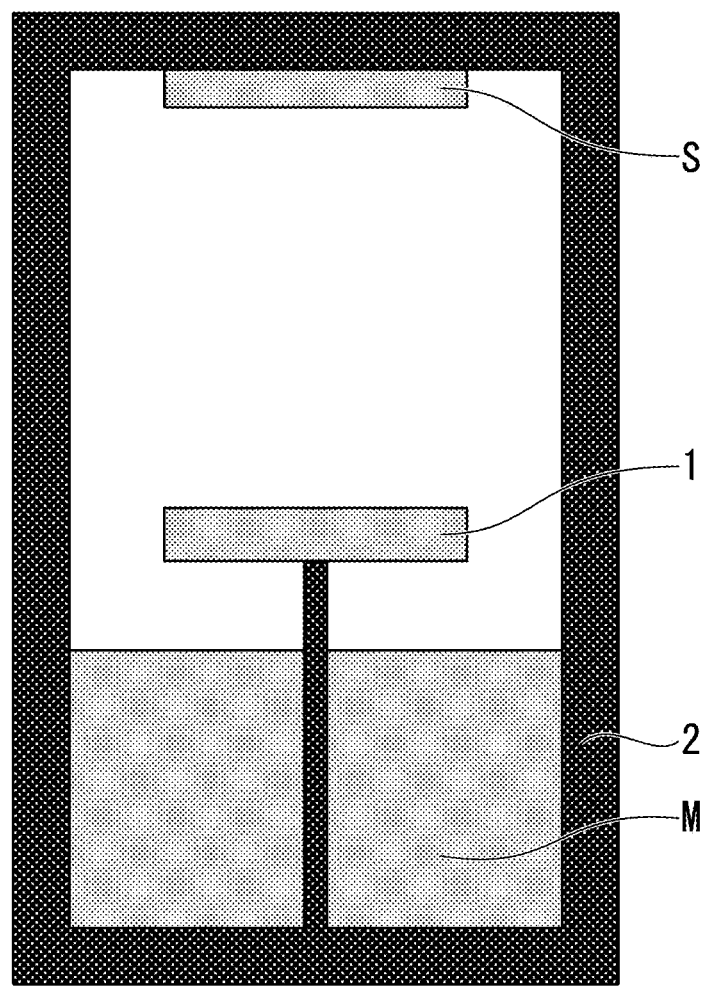
FIG. 2 is a schematic longitudinal cross-sectional view showing a structural model of the single crystal manufacturing apparatus used for simulation.

Next, a simulation result of the surface temperature of the seed crystal will be described for comparison between the heat-insulating shield member of the present invention and the graphite shield plate of the related art using a model as shown in FIG. 2.

The simulation was carried out using a vapor phase crystal growth analysis software "Virtual Reactor" manufactured by STR-Group Ltd. As a structural model of the single crystal manufacturing apparatus used for simulation, a simple structure with a columnar crucible, a base disposed on a back side of an upper lid, a shield member (shield plate), and a SiC source provided at a lower portion of the crucible, in which the seed crystal is placed on the base, is employed in order to confirm the heat-insulating effect of the heat-insulating shield member of the present invention with respect to the shield plate of the related art.

In the structural model of the single crystal manufacturing apparatus used for the simulation, the crucible was made of graphite, of which inner diameter was 230 mm, and the seed crystal was made of SiC, of which the diameter was 150 mm.

It is difficult to know the accurate value of the thermal conductivity at the high temperature, for example, at which the SiC single crystal is grown. Therefore, in the structural model of the single crystal manufacturing apparatus used for the simulation, the thermal conductivity of the heat-insulating shield member of the present invention is defined by a ratio of the size to the thermal conductivity in the graphite shield plate of the related art.

The shield plate has a diameter of 170 mm and a thickness of 5 mm. A plate made of graphite (corresponding to (b) of Table 1) is used as the shield plate of the related art. A member with the thermal conductivity in the thickness direction of 2.5% of the thermal conductivity of the shield plate of the related art is used as the heat-insulating shield member of the present invention (corresponding to a heat-insulating shield member made of felt) (corresponding to (c) of Table 1). A member in which the thermal conductivity in the plane direction with respect to the thermal conductivity in the thickness direction is ⅙ and the thermal conductivity in the thickness direction is 6.9% of the thermal conductivity of the shield plate of the related art is used as the thermally anisotropic graphite material of the present invention (corresponding to a heat-insulating shield member made of a graphite sheet) (corresponding to (d) in Table 1). A distance between the seed crystal and the shield plate or the heat-insulating shield member is 70 mm. The temperature at the highest temperature point in the crucible lower portion is fixed at 2300° C.

Figure 3:
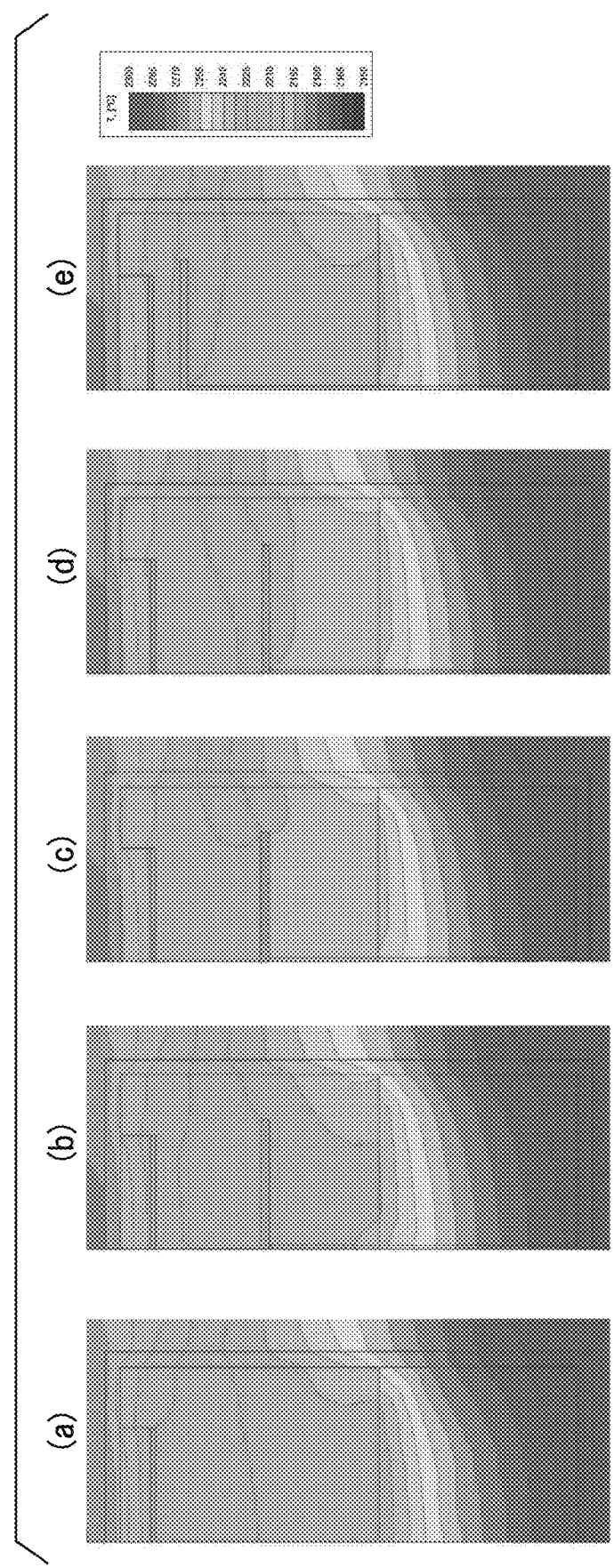
FIG. 3 is a diagram showing a temperature distribution in the single crystal manufacturing apparatus, which is established by simulation.

FIG. 3 shows a temperature distribution, which is established by simulation.

Table 1 also shows the temperature of each portion based on the temperature distribution established by the simulation.

Regarding (a) to (e) in FIG. 3 and Table 1, (a) indicates a case where the shield plate is not used, (b) indicates a case where the graphite shield plate of the related art is used (the distance between the seed crystal and the shield plate is 70 mm), (c) indicates a case where a heat-insulating shield member (the heat-insulating shield member of the present invention) is adopted, of which the thermal conductivity is 2.5% of that of the shield plate of the related art, (d) indicates a case where a thermally anisotropic shield member (the heat-insulating shield member of the present invention) is adopted, in which the thermal conductivity in the plane direction with respect to the thermal conductivity in the thickness direction is ⅙ and the thermal conductivity in the thickness direction is 6.9% of the thermal conductivity of the shield plate of the related art, and (e) indicates a case where the shield plate of the related art made of graphite is used and the shield plate is brought closer to the seed crystal by ¼ of the distance in the case (b) (that is, the distance between the seed crystal and the shield plate is 17.5 mm).

TABLE 1

|  | Seed Crystal Temperature | SiC source Surface Temperature | SiC source Lower Portion Temperature | Vertical Temperature Difference | Temperature Difference in SiC source |
|---|---|---|---|---|---|
| (a) No Shield Plate | 2219.7 | 2225.6 | 2297.7 | 5.9 | 72.1 |
| (b) Shield Plate of Related Art | 2215 | 2231.5 | 2297.9 | 16.4 | 66.4 |
| (c) Heat-insulating Shield Member | 2211.2 | 2235.5 | 2297.9 | 24.4 | 62.4 |
| (d) Thermally Anisotropic Shield Member | 2211.9 | 2234.9 | 2297.9 | 22.9 | 63 |
| (d) Shield Plate of Related Art (with Distance of ¼) | 2211.9 | 2228.5 | 2297.9 | 16.6 | 69.4 |

The unit of the numerical value in Table 1 is ° C.

Additionally, in Table 1, the seed crystal temperature is a temperature of the seed crystal surface on a side of the SiC source housing. The SiC source surface temperature is a temperature of the surface of the SiC source contained in the SiC source housing on a side of the seed crystal. The SiC source lower portion temperature is a temperature of the surface of the SiC source contained in the SiC source housing, which is in contact with the bottom of the crucible. The vertical temperature difference is a temperature difference between the seed crystal temperature and the SiC source surface temperature. The temperature difference in SiC source is a temperature difference between the SiC source surface temperature and the SiC source lower portion temperature.

As shown in Table 1, in a case of using the heat-insulating shield member of the present invention, it is found that the effect of lowering the temperature of the seed crystal (seed) equivalent to that in a case where the distance between the seed crystal and the shield plate is reduced to ¼ of the original distance. However, according to the method of bringing the seed crystal and the shield plate closer to each other, the temperature difference in SiC source is large and a problem is expected wherein precipitation occurs on the SiC source surface. Thus, the method using the heat-insulating shield member of the present invention is more effective.

In a case of using the shield plate of the related art, the vertical temperature difference is 16.4° C. In a case where the heat-insulating shield member (c) of the present invention is used, the vertical temperature difference is 24.4° C. In a case where the heat-insulating shield member (d) of the present invention is used, the vertical temperature difference is 22.9° C. Both cases show considerably larger vertical temperature difference than in a case of using the shield plate of the related art. This result is far beyond the inventor's expectations.

The temperature difference in SiC source is 66.4° C. in a case of using the shield plate of the related art, but is 62.4° C. in a case of using the heat-insulating shield member (c) of the present invention and is 63.0° C. in a case of using the heat-insulating shield member (d) of the present invention.

Both cases show considerably improved results than in a case of using the shield plate of the related art.

It is extremely difficult to actually measure the parameters in the crystal growth container, since the growth of the silicon carbide single crystal is effected by various parameters and the inside of the container has a high temperature exceeding 2000° C. for during crystal growth. For this reason, temperature distribution analysis using the simulation plays a large role in designing a configuration and the like that realize optimal temperature distribution in the container. That is, the following procedure is usually employed: designing a furnace structure and the like based on the findings obtained from the simulation, confirming the effect by actually growing the single crystal with the furnace structure and the like, and finely adjusting the structure and the like to obtain the optimum furnace structure and the like. The simulation will also be indispensable in the future to avoid wasteful trial and error. The simulation is utilized to the utmost in the present invention.

The heat-insulating shield member 1 of the present invention may be formed by a single type of material only. A shape of this member can be optionally selected. For example, a circular flat plate capable of optionally selecting the thickness is an exemplary example. It is preferable that the thickness is uniform, but it may be different depending on positions. The heat-insulating shield member 1 of the present invention is preferably formed by a single shield plate, but is not limited to this example.

The heat-insulating shield member 1 of the present invention may be formed by using two or more types of materials.

Figure 4:
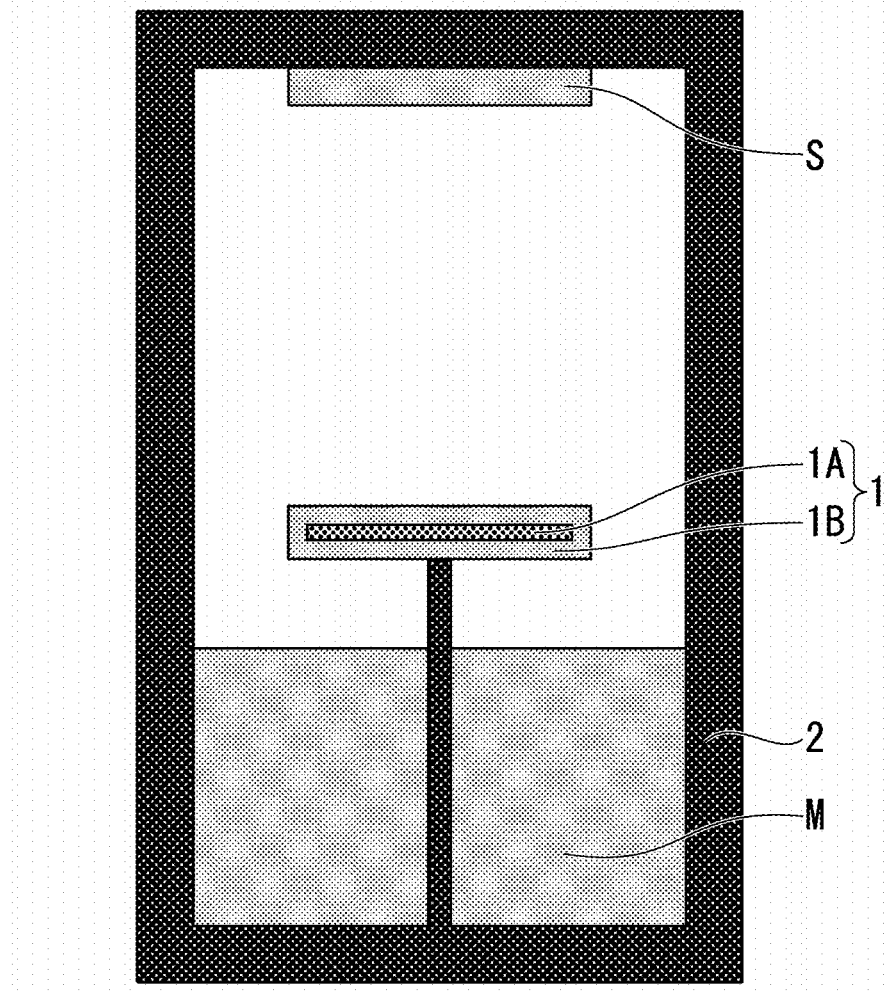
FIG. 4 is a schematic longitudinal cross-sectional view showing a preferable example of a heat-insulating shield member according to another embodiment of the present invention, and a single crystal manufacturing apparatus of the present invention, which is provided with the same heat-insulating shield member.
Figure 5:
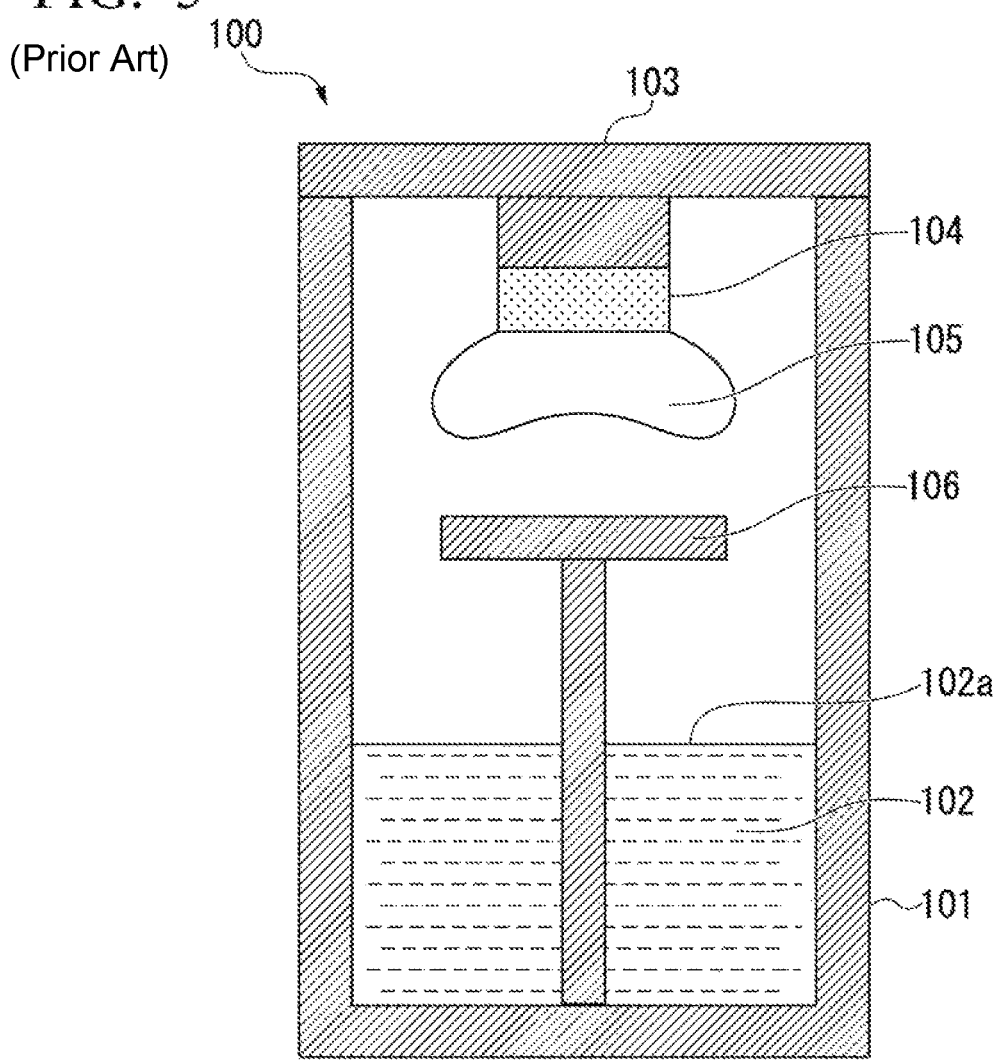
FIG. 5 is a schematic longitudinal cross-sectional view showing a single crystal manufacturing apparatus of the related art.

As shown in FIG. 4, the heat-insulating shield member 1 of the present invention may have a structure in which the heat-insulating material 1A is wrapped with the graphite material 1B. It is also preferable that the entire surface of the heat-insulating material 1A is wrapped in the graphite material 1B.

According to this configuration, even if the heat-insulating material 1A is a material that easily reacts with the SiC source gas, the reaction can be avoided or suppressed by the graphite material 1B. Type, shape and condition of the graphite material may be optionally selected. Examples thereof include graphite material or graphite sheet having no opening, non-porous graphite material or graphite sheet, and the like. Since the SiC source sublimation gas is mainly Si, $Si_2C$, and/or $SiC_2$, the reaction with C of the graphite material as the heat-insulating material sometimes occurs. In particular, porous graphite material such as carbon fiber material has a large specific surface area and is more likely to react than normal graphite. As the reaction occurs, the graphite material changes into a more sparse state, and there is a possibility that the graphite powder tends to fly in the crucible. This graphite powder is taken into the SiC single crystal as a carbon inclusion and may induce crystal defects such as micropipes. Therefore, it is desirable to wrap the porous graphite material with another graphite material which is hard to react, rather than a naked state.

In FIG. 4, the heat-insulating material 1A and the graphite material 1B are drawn without a gap, but a space may be provided therebetween.

In the heat-insulating shield member 1 of the present invention, a part or all of its surface may be covered with a metal carbide layer.

As the metal carbide, for example, at least one selected from the group consisting of TaC, WC, NbC, MoC and the like can be preferably adopted.

According to this configuration, even if the interior is a material which easily reacts with the SiC source gas, the reaction can be avoided or suppressed by the metal carbide layer. The graphite material in the crucible decently reacts with the SiC source gas. Therefore, in long-term growth, the graphite powder may fly even when the graphite material which is hardly react is used. For this reason, the metal carbide coating is preferable for increasing the length of the crystal. The metal carbide coating without an opening is an exemplary example.

As the crucible 2, any known crucible may be used as long as it is a crucible which can produce a silicon carbide single crystal by a sublimation. For example, graphite, tantalum carbide, or the like can be used. The crucible 2 is heated to a high temperature during growth. Therefore, it have to be formed of a material tolerable to the high temperature. For example, graphite has an extremely high sublimation temperature of 3550° C., and can endure the high temperature during growth.

As shown in FIG. 1, the base 4 protruding downward is provided at the inner center portion of the crucible lid 2B, and it is possible that the silicon carbide seed crystal S is bonded to one surface (seed crystal side surface) 4a of the base 4. The crucible main body 1 is covered with the crucible lid 2B, and thus the base 4 faces the silicon carbide single crystal growth SiC source M contained in the crucible 2. Since the silicon carbide single crystal growth SiC source M faces the seed crystal S installed on the base 4, it is possible to efficiently supply the SiC source gas to the seed crystal S. The crucible lid 2B and the base 4 may be formed as an integral member or may be formed as separate members.

The base 4 is preferably provided at the center in the left-right direction of the crucible lid 2B. By providing the base 4 at the center in the lateral direction of the crucible lid 2B, the growth rate of the silicon carbide single crystal W can be constant in the left-right direction.

The crucible lid 2B and the base 4 are not particularly limited as long as they can endure the high temperature, and the same materials as that of the crucible 2 can be used.

Generally known heating member 5 can be used. As the heating member 5, for example, a high-frequency coil or the like can be used.

As described above, according to the present invention, it is possible to provide the heat-insulating shield member capable of suppressing precipitation on the SiC source surface while suppressing contamination of 6H—SiC.

EXPLANATION OF REFERENCES 1 heat-insulating shield member
1A heat-insulating material
1B graphite material
2, 101 crystal growth container (crucible)
2A crucible main body
2B crucible lid
3 SiC source housing
4 substrate support
4a seed crystal side surface of base
5 heating member
10, 100 single crystal manufacturing apparatus
102, M SiC source portion (SiC source, SiC source power)
102a, Ms SiC source surface
103 lid
104, S crystal growth substrate (seed crystal)
105 single crystal
106 shield plate
W grown crystal

What is claimed is:

1. A heat-insulating shield member, wherein
the heat-insulating shield member is arranged and used between a SiC source housing and a substrate support in a single crystal manufacturing apparatus,
wherein the single crystal manufacturing apparatus comprises
a crystal growth container and
a heating member arranged on an outer periphery of the crystal growth container,
wherein the crystal growth container includes
the SiC source housing, wherein the SiC source housing is disposed at a lower portion of the apparatus,
the substrate support, wherein the substrate support is arranged above the SiC source housing and supports a substrate so as to face the SiC source housing,
the heat-insulating shield member which is arranged and used between the SiC source housing and the substrate support, and
a supporting rod which supports a center of the heat-insulating shield member from a lower side,
wherein the single crystal manufacturing apparatus is configured to grow a single crystal from a SiC source on the substrate by sublimating the SiC source from the SiC source housing,
wherein the heat-insulating shield member contains a low thermally conductive carbon material having thermal conductivity lower than graphite,
the low thermally conductive carbon material consists of carbon,
a diameter of the heat-insulating shield member is smaller than an inner diameter of the crystal growth container, and
the heat-insulating shield member is made of a heat-insulating material having thermal conductivity of 1 to 3.25 W/m·K in at least a thickness direction at room temperature.

2. The heat-insulating shield member according to claim 1, wherein the low thermally conductive carbon material is either a carbon fiber material or expanded graphite.

3. The heat-insulating shield member according to claim 1, wherein the low thermally conductive carbon material is a graphite material having thermal anisotropy.

4. The heat-insulating shield member according to claim 1, wherein the heat-insulating shield member has a structure in which a heat-insulating material is surrounded by a graphite material.

5. The heat-insulating shield member according to claim 1, wherein the heat-insulating shield member has a surface which is coated by a metal carbide layer.

6. A single crystal manufacturing apparatus comprising:
a crystal growth container and
a heating member arranged on an outer periphery of the crystal growth container,
wherein the crystal growth container includes
a SiC source housing disposed at a lower portion of the apparatus,
a substrate support which is arranged above the SiC source housing and supports a substrate so as to face the SiC source housing,
a heat-insulating shield member which is arranged and used between the SiC source housing and the substrate support, and
a supporting rod which supports a center of the heat-insulating shield member from a lower side,
wherein the heat-insulating shield member contains a low thermally conductive carbon material having thermal conductivity lower than graphite,
wherein the low thermally conductive carbon material consists of carbon, and a diameter of the heat-insulating shield member is smaller than an inner diameter of the crystal growth container,
wherein the single crystal manufacturing apparatus is configured to grow a single crystal from a SiC source on the substrate by sublimating the SiC source from the SiC source housing, and
the heat-insulating shield member is made of a heat-insulating material having thermal conductivity of 1 to 3.25 W/m·K in at least a thickness direction at room temperature.

7. The heat-insulating shield member according to claim 1, wherein
the heat-insulating shield member is made of the low thermally conductive carbon material.

8. The heat-insulating shield member according to claim 1, wherein the heat-insulating shield member is made of porous carbon.

9. The heat-insulating shield member according to claim 1, wherein the heat-insulating shield member is made of a graphite material in which thermal conductivity thereof is anisotropic in the thickness direction and a direction orthogonal to the thickness direction, and is formed by pressing expanded graphite into a compacted sheet shape.

10. The single crystal manufacturing apparatus according to claim 6, wherein
the heat-insulating shield member is arranged between the SiC source housing and the substrate support in a single crystal manufacturing apparatus.

11. The single crystal manufacturing apparatus according to claim 6, wherein
the heat-insulating shield member is made of the low thermally conductive carbon material.

12. The single crystal manufacturing apparatus according to claim 6, wherein
the heat-insulating shield member is made of porous carbon.

13. The single crystal manufacturing apparatus according to claim 6, wherein
the heat-insulating shield member is made of a graphite material in which thermal conductivity thereof is anisotropic in the thickness direction and a direction orthogonal to the thickness direction, and is formed by pressing expanded graphite into a compacted sheet shape.

14. The heat-insulating shield member according to claim 1, wherein the heat-insulating shield member has a circular flat plate shape, and the crystal growth container has a columnar crucible shape.

15. The heat-insulating shield member according to claim 1, wherein the heat-insulating shield member consists of the low thermally conductive carbon material.

16. The single crystal manufacturing apparatus according to claim 6, wherein the heat-insulating shield member has a circular flat plate shape, and the crystal growth container has a columnar crucible shape.

17. The single crystal manufacturing apparatus according to claim 6, wherein the heat-insulating shield member consists of the low thermally conductive carbon material.

18. The single crystal manufacturing apparatus according to claim 6, wherein the heat-insulating shield member satisfies at least one selected from the following characteristics (i) to (iv):
- (i) the low thermally conductive carbon material consists of a carbon fiber material,
- (ii) the low thermally conductive carbon material consists of expanded graphite,
- (iii) the low thermally conductive carbon material consists of a graphite material having thermal anisotropy,
- (iv) the heat-insulating shield member has a structure in which a heat-insulating material is surrounded by a graphite material, and
- (v) the heat-insulating shield member has a surface which is coated by a metal carbide layer.

19. The heat-insulating shield member according to claim 1, wherein the thermal conductivity of the heat-insulating shield member in the thickness direction is smaller than the thermal conductivity of the heat-insulating shield member in the plane direction.

20. The single crystal manufacturing apparatus according to claim 6, wherein the thermal conductivity of the heat-insulating shield member in the thickness direction is smaller than the thermal conductivity of the heat-insulating shield member in the plane direction.

\* \* \* \* \*